United States Patent [19]
Koenig

[11] Patent Number: 4,954,791
[45] Date of Patent: Sep. 4, 1990

[54] NON-COMMENSURATE LINE LENGTH RF MODULATOR

[75] Inventor: Mary K. Koenig, Santa Rosa, Calif.

[73] Assignee: Hewlett-Packard Company, Palo Alto, Calif.

[21] Appl. No.: 414,946

[22] Filed: Sep. 29, 1989

[51] Int. Cl.$^5$ .............................................. H03C 1/62
[52] U.S. Cl. ...................................... 332/164; 332/174
[58] Field of Search .............. 332/163, 164, 165, 174; 333/164, 174, 204, 205

[56] References Cited

U.S. PATENT DOCUMENTS 4,438,415 3/1984 Hopfer ............................ 333/164 X Primary Examiner—David Mis
Attorney, Agent, or Firm—William C. Milks, III

[57] ABSTRACT

In a reflective shunt-diode radio-frequency modulator the shunting diodes are spaces so that the transmission line sections between diode pairs have non-commensurate lengths. The transmission line length sections between diode pairs are selected so that a minimum in the frequency/attenuation curve resulting from one transmission line section/diode pair is cancelled by a maximum in the frequency/attenuation curve from another transmission line section/diode pair. The superposition of the frequency characteristics from all transmission line section/diode pairs results in a structure in which reactive cancellation occurs over the entire operating frequency range. Consequently, it is not necessary to saturate the shunting diodes at the low band end to maintain maximum attenuation. In addition, to improve insertion loss, capacitive stubs are located along the transmission line which modify the filter characteristics when the shunting diodes are turned "off".

16 Claims, 9 Drawing Sheets

NON-COMMENSURATE LINE LENGTH RF MODULATOR

FIELD OF THE INVENTION

This invention relates to radio-frequency (RF) modulators and, in particular, to reflective shunt-diode modulators.

BACKGROUND OF THE INVENTION

In many microwave devices, such as power amplifiers, signal generators and oscillators, it is desirable to be able to control the amplitude of the output either automatically or manually. In this manner, the radio-frequency source output can be level controlled or pulsed as necessary.

In order to modulate the output of a radio frequency source, a modulator or attenuator is usually connected in series with the source. Generally, it is desirable that this modulator be linear over a predetermined range of frequencies and that the amount of attenuation produced by the modulator is proportional to some input signal or voltage. Such a linear modulator can be used in a feedback loop which can automatically control the modulator to hold the output of the radio frequency source constant.

A conventional radio frequency (RF) modulator design that is commonly-used in radio frequency circuits is a reflective shunt diode modulator. Such a modulator consists of a transmission line which is connected to ground at intervals by PIN diodes. In accordance with well-known RF practice, in order to reduce the device insertion loss as much as possible, the diodes are spaced equally along the transmission line and the length of the transmission line sections between diode pairs is selected to ¼ of the wavelength of the RF signal at the high end of the operating frequency range.

With such a configuration, the device has essentially two operating states. In the first of the two states, the diodes are "off" and the device has the frequency characteristics of a filter since the "off" diodes appear as capacitances. Consequently, RF power flowing along the transmission line is not significantly attenuated.

In the second or "on" state, the diodes are biased by a DC current into a conducting state, essentially causing low-resistance short circuits to appear along the transmission line. The diode induced shorts divide the line into quarter wavelength sections at the high band end. Consequently, at the high band end, reactive cancellation occurs in the quarter wavelength sections, in turn causing the device to highly attenuate RF power flowing through the device.

The problem with such a prior art modulator is that it cannot effectively cover a typical operating frequency range. In particular, as the RF frequency drops, the RF wavelength increases and the transmission line sections connected between the diodes are no longer quarter wavelength sections. For example, at the low band end the RF wavelength may increase to such an extent that the line sections are ⅛ wavelength or less. At this point the reactive canalling effect produced by the transmission line sections all but disappears and the transmission lines appear as simple short circuits. Consequently, the attenuation of the device is simply the "on" resistance of the diodes connected in parallel.

To maintain an attenuation equivalent to that obtained at higher freqencies when reactive cancellation is effective, it is necessary to reduce the "on" resistance of the diodes at lower operating frequencies. A typical prior art method of reducing diode forward resistance is to increase the forward bias current on the diodes at the low band end. Thus, it is possible to maintain reasonably constant attenuation over a broader operating frequency range by varying the diode bias current.

This necessary change in bias current with respect to operating frequency can make the prior art modulator difficult to use in certain circuits. For example, the prior art modulator device may be used in a feedback loop in which the modulator bias current is controlled by an automatic feedback circuit which samples the output of the device and utilizes negative feedback to maintain a constant output. In such a circuit the change in bias current, necessary to maintain a constant output at changing frequency, is equivalent to a feedback loop gain change which may cause the loop to become unstable as the frequency changes across the operating frequency range.

Furthermore, the increased bias current necessary to maintain high attenuation at the low band end drives the diodes into saturation and, thus, the diode switching time is increased. Consequently, in order to use the prior art modulator as a pulse modulator with fast switching times, the operating frequency range must be limited to two frequency octaves. Consequently, the prior art devices tend to have either limited bandwidths or poor pulse switching characteristics.

Accordingly, it is an object of the present invention to provide a radio frequency modulator which has an extended operating frequency range.

It is a further object of the present invention to provide a radio frequency modulator which has a high pulse switching rate.

It is another object of the present invention to provide a radio-frequency modulator in which the bias current required to achieve a predetermined attenuation is constant across the entire operating frequency range.

It is still a further object of the present invention to provide a radio frequency reflective shunt-diode modulator which needs less current to operate at maximum attenuation and in which the diodes are operating in their small-signal region.

It is yet another object of the present invention to provide a radio frequency modulator in which maximum attenuation can be obtained without driving the operating diodes into saturation.

It is a further object of the present invention to provide a radio-frequency modulator in which pulse rise and fall times are improved over prior art circuitry.

SUMMARY OF THE INVENTION

The foregoing objects are achieved and the foregoing problems are solved in one illustrative embodiment of the invention consisting of a reflective shunt diode radio frequency modulator in which the shunting diodes are spaced so that the transmission line sections between diode pairs have non-commensurate lengths. The transmission line length sections between diode pairs are selected so that a minimum in the the frequency/attenuation curve resulting from one transmission line section/diode pair is cancelled by a maximum in the frequency/attenuation curve from another transmission line section/diode pair. The superposition of the frequency characteristics from all transmission line section/diode pairs results in a structure in which reactive cancellation occurs over the entire operating frequency range. Consequently, it is not necessary to saturate the shunting diodes at the low band end to maintain maximum attenuation.

In addition, to improve insertion loss, capacitive stubs are located along the transmission line which modify the filter characteristics when the shunting diodes are turned "off".

DETAILED DESCRIPTION OF THE PREFERRED EMBODIMENT

Figure 1:
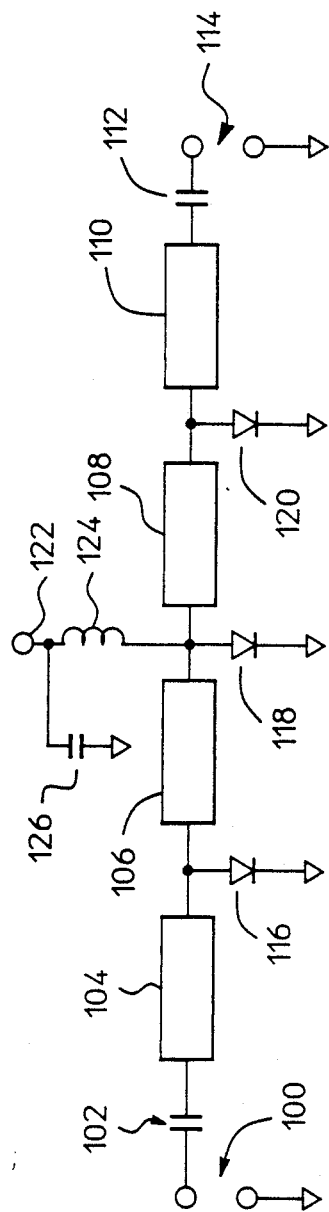
FIG. 1 is a schematic diagram of a prior art reflective shunt-diode modulator utilizing equal transmission line lengths between the shunting diodes.

FIG. 1 is a schematic diagram of a conventional reflective shunt diode modulator. In general, the device has an input 100 to which an RF source is connected and an output 114 which is connected to a load and functions to attenuate RF power flowing through it. The modulator is constructed using a plurality of PIN diodes 116, 118 and 120. Although only three diodes are shown in FIG. 1, conventional modulators may use four, five or more diodes to obtain desired attenuations.

Diodes 116, 118 and 120 are connected to input 100 and output 114 by means of transmission line lengths 104 and 110. According to the operating frequency range and characteristics, transmission lines 104 and 110 may be stripline, microstrip or other conventional lines. Diode 116 is also connected to diode 118 via transmission line 106 and diode 118 is connected to diode 120 by a second transmission line 108. The transmission line and diode structure is isolated from input 100 by means of decoupling capacitor 102 and is isolated from output 114 by means of decoupling capacitor 112.

Diodes 116, 118 and 120 are connected between the transmission line structure and signal ground. A bias structure (schematically shown consisting of DC bias source 122, isolating inductor 124 and decoupling capacitor 126) is connected to a point on transmission line/diode structure. During operation, if a forward biasing potential is placed on bias terminal 122, current flows through inductor 124 and causes diodes 116, 118 and 120 to go into their forward-biased or "on" state. Decoupling capacitors 102 and 112 prevent the DC bias current from entering the input 100 or output 114 and inductor 124 prevents RF power travelling down the transmission line structure from flowing back to the DC bias source.

When a reverse biasing potential is placed on bias terminal 122 diodes 116, 118 and 120 are placed in their non-conducting or "off" state. In the "off" state the diodes appear as capacitances connected to ground. Consequently, as is well-known, when the diodes are in the "off" state, the device acts as a low-pass filter with the transmission line sections having a characteristic inductive impedance and the diodes having a characteristic resistive and capacitive impedance.

However, in the "on" state, when diodes 116, 118 and 120 are conducting, they act as low value resistances which short the transmission line paths at the points where they are connected to the structure. In order to achieve high attenuation of RF power passing through the modulator structure, transmission line sections 106 and 108 are designed to provide reactive cancellation of the input power to enhance the attenuation produced by the shunting diodes.

In particular, in order to reduce the insertion loss of the modulator, it is conventional to select the length of sections 106 and 108 such that their electrical length is equal to one-quarter of a wavelength at the highest frequency in which the device is to be used. Such a configuration provides a low insertion loss when the diodes 116, 118 and 120 are in their "off" state and provides a high attenuation when diodes 116, 118 and 120 are in their "on" state.

However, as previously mentioned, when the device shown in FIG. 1 must operate over a relatively wide frequency range, the device characteristics change as the operating frequency becomes lower. In particular, as the frequency of the RF power passing through the device decreases, the wavelength increases so that transmission sections 106 and 108 are no longer equal to one-quarter of a wavelength, but become less than one-quarter of a wavelength. At frequencies which are relatively low compared to the highest design frequency, the length of the transmission line sections becomes one-eighth of a wavelength or less. At this length, the reactive cancellation produced by sections 106 and 108 essentially disappears so that at the low end of the operating frequency range, sections 106 and 108 effectively appear as short circuits. Accordingly, the maximum attenuation of the device at low frequencies is essentially the "on" resistance of diodes 116, 118 and 120 connected in parallel.

Thus, in order to make the modulator attenuation constant over its operating frequency range, it is necessary to make the "on" resistance of the diodes 116, 118 and 120 at the low end of the frequency range as low as possible so that the diode attenuation at the low end of the frequency band will be substantially the same as the high frequency attenuation caused by the reactive cancellation of transmission lines 106 and 108 plus the diode attenuation. One way to reduce the "on" resistance of diodes 116, 118 and 120 at low frequencies is to increase the forward bias current and drive the diodes into saturation. Thus, in order to maintain constant attenuation over the operating frequency range, the bias current in prior art modulators must be increased significantly as the RF frequency is reduced from the high end of the band to the low end of the band.

Such a bias characteristic, by itself, is generally not a problem. However, when the device is used in an automatic loop control system (a common use for such modulators) the relation between bias current and frequency may cause instability in the automatic loop control circuitry.

Figure 2:
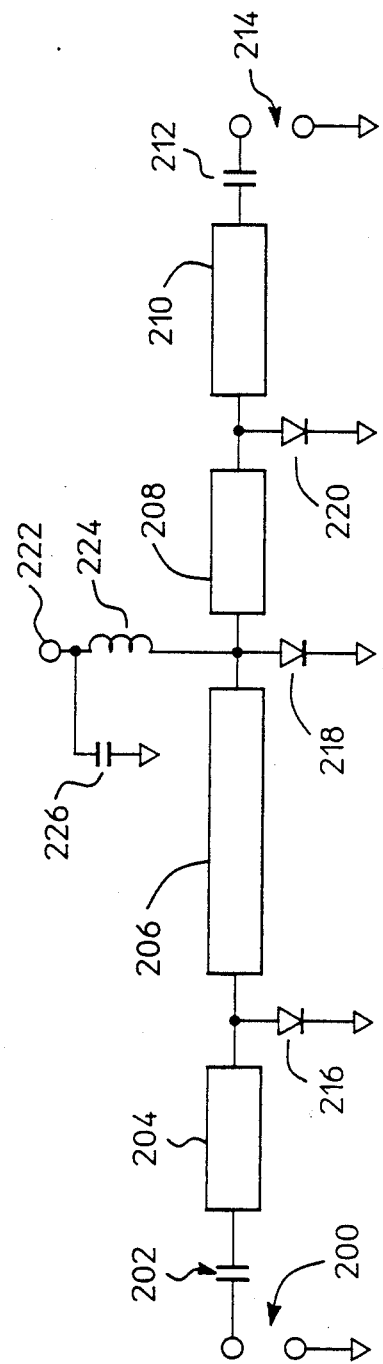
FIG. 2 is a schematic diagram of an illustrative embodiment of the invention with three diodes showing the unequal transmission line lengths connecting the shunting diodes.

A schematic diagram of a modulator constructed in accordance with the principals of the invention is shown in FIG. 2. In FIG. 2, elements which correspond to those shown in FIG. 1 have corresponding numerals. For example, input 200 corresponds to input 100; decoupling capacitor 202 corresponds to capacitor 102, etc.

A comparison of FIG. 1 with FIG. 2 indicates that the basic modulator structure is the same with the exception that transmission line 206 has a different length than transmission line 208, whereas in the prior art structure, transmission lines 106 and 108 have the same length. The differing lengths of transmission lines 206 and 208 provide a major advantage in the inventive structure.

In particular, when diodes 216, 218 and 220 are in their "on" state in accordance with conventional well-known waveguide theory, the frequency response of the modulator structure can be considered to be a superposition of voltage waves which would be created by a structure which consists of a pair of diodes connected by a transmission line. Since the transmission lines have unequal lengths in the structure, the quarter wavelength frequency of each of the structures is different.

Figure 3:
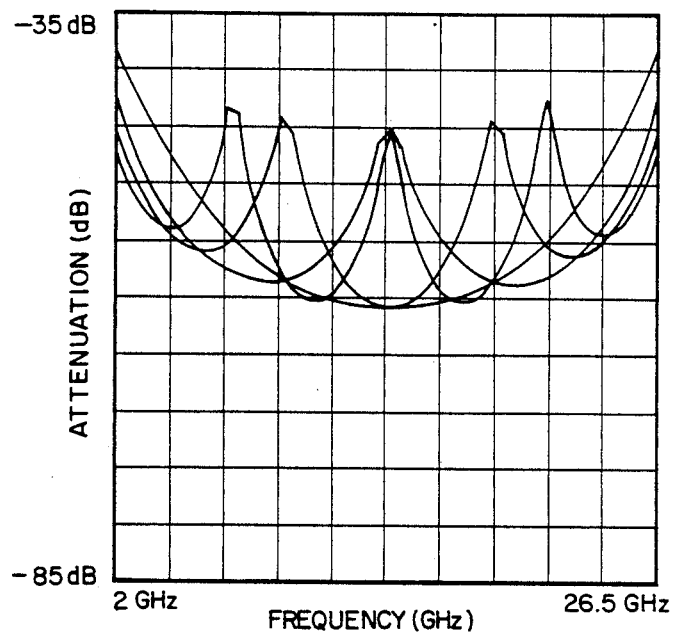
FIG. 3 is a frequency versus attenuation plot of several transmission line/diode pair sets with different transmission line lengths.

More particularly, FIG. 3 is an attenuation versus frequency plot for four, different two diode and transmission line configurations each of which has a different transmission line length. The reactive cancellation produced in each structure results in maximum attenuation at RF wavelengths where the transmission line structure is an odd multiple of one quarter of the RF wavelength. Minimum attenuation occurs where the transmission line structure is an even multiple of one quarter of the RF wavelength. As shown in FIG. 3, the transmission line lengths can be selected so that the maximum attenuation points of some line structures will cancel the minimum attenuation points resulting from other structures. When these waveforms are superimposed, a relatively flat frequency response with some ripple results. Such a frequency response is shown in the attenuation versus frequency plot in FIG. 4.

Figure 4:
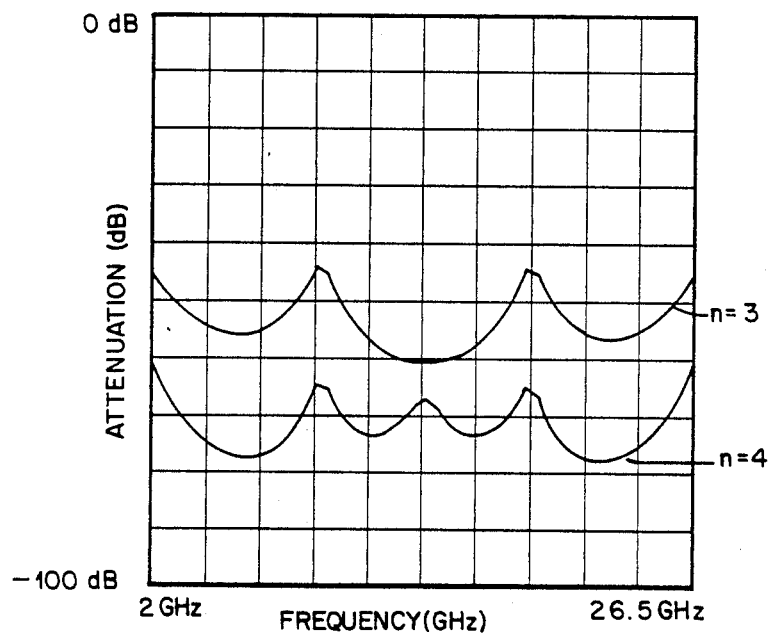
FIG. 4 is a frequency versus attenuation plot of the resulting frequency characteristic of inventive modulators with three and four diodes, respectively, when the frequency characteristics of the transmission line/diode pairs are superimposed.

In FIG. 4, the upper response curve is shown for a modulator constructed with three diodes, such as the structure shown in FIG. 2, and the lower response curve is the response for a modulator constructed with four diodes. A similar response curve could be obtained for five, six, seven and more diodes. As shown in FIG. 4, as the number of diodes increases, the ripple in the frequency response decreases (although the ripple frequency increases).

However, the frequency response of the inventive structure remains relatively constant across the entire operating frequency range and, consequently, with the inventive structure it is not necessary to increase the diode bias current at the low end of the operating frequency range to obtain substantially the same attenuation as of the high end of the frequency range. Therefore, with such a structure, the shunt diodes can be operated in their small signal range and, since the diodes are not saturated, their switching time is much faster and the inventive device can be used as a fast pulse modulator as well as a linear modulator.

Figure 5:
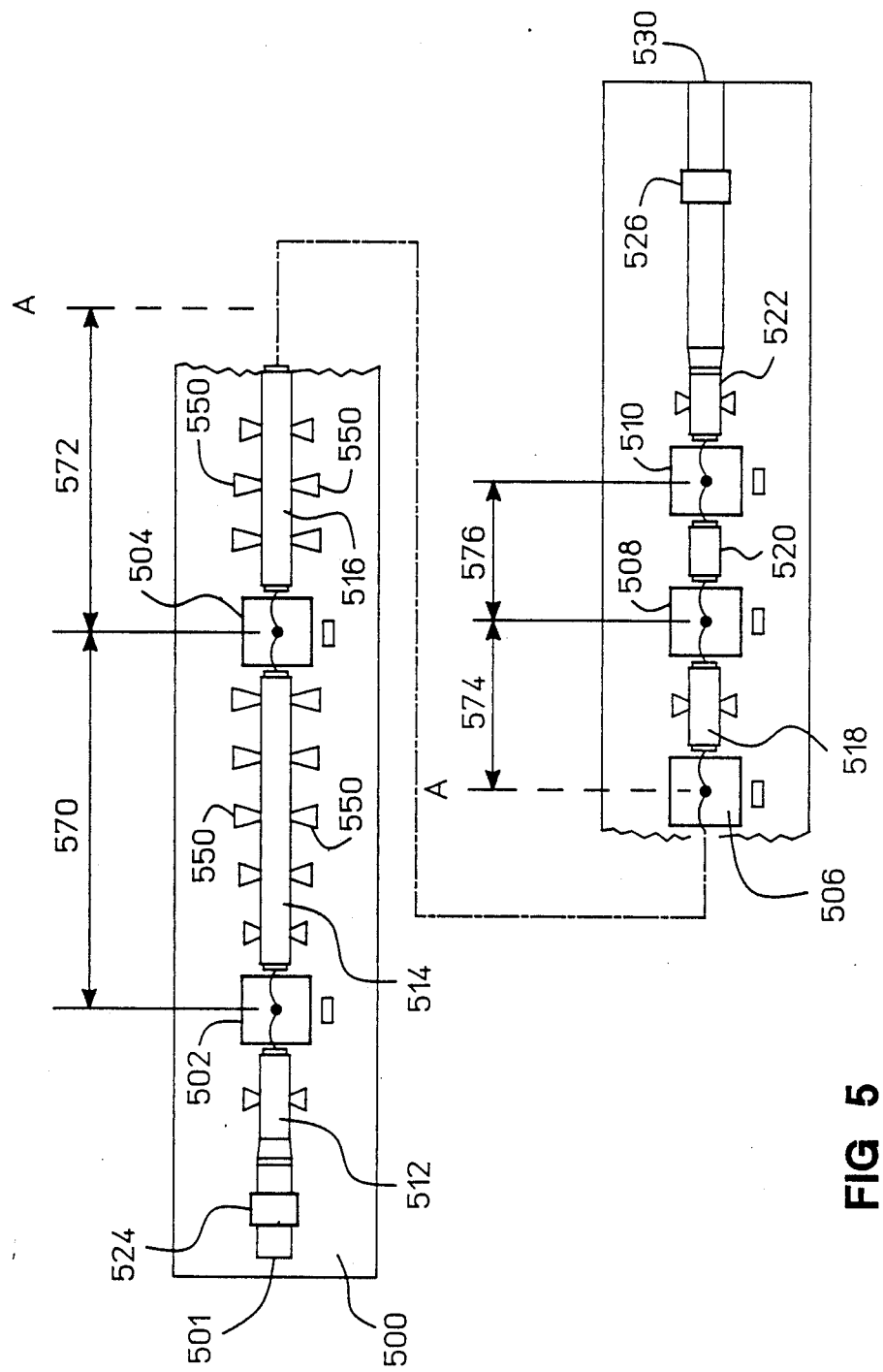
FIG. 5 is a plan view of an illustrative embodiment of the present invention utilizing five shunt diodes and construction using microstrip configuration.

FIG. 5 of the drawing is a plan view of an illustrative practical construction of a five shunt diode modulator. The device is illustratively constructed using conventional microstrip technology. In this type of construction, microstrip transmission line circuit patterns are formed on a substrate 500, which might be illustratively 10-mil alumina substrate. Typically, transmission line patterns 512, 514, 516, 518, 520 and 522 might be formed by a gold deposition process on substrate 500 to connect input 501 with output 530.

Five diodes, 502-510, are mounted in holes which are laser cut in substrate 500 for precise diode placement. The entire substrate 500 is cemented to a grounded base plate (not shown) by means of conductive epoxy cement. Diodes 502-510 may illustratively be chip mesa PIN diodes, which are also cemented with conductive epoxy to the base plate in the laser-cut holes. As will be discussed in connection with FIGS. 8 and 9, a bonded gold mesh is used to connect the diode anodes to the circuit patterns. Decoupling capacitors 524 and 526 may illustratively be beam lead capacitors which are also bonded to the circuit patterns as shown.

A bias structure not shown in FIG. 5 is also provided to operate diodes 502-510. This bias structure will be discussed in detail below with respect to FIG. 10.

As shown in FIG. 5 and in accordance with the invention, the transmission line length 570 of line 514 is not the same as the length 572 of line 516. Also the length 574 of line 518 is not the same as lengths 570 and 572. These lengths are illustratively chosen so that the maximums and minimums of attenuation over the operating frequency range cancel to produce a relatively flat attenuation characteristic as shown in FIG. 4. The structure in FIG. 5 actually operates as a four diode modulator since the spacing 576 between diodes 508 and 510 is so short that the two diodes essentially act as a single diode to provide extra attenuation at the high end of the frequency range.

Also shown in FIG. 5 is another important feature of the present invention. In particular, radial stub capacitors 550 are spaced along transmission line patterns 512-522 at intervals of less than one-quarter wavelength at the high frequency end of the operating frequency range. In the "off" circuit state in which the diodes 502-510 are nonconducting, capacitors 550 form a distributed filter structure together with transmission line structures. The cutoff frequency of the filter structure is determined by the spacing between the radial stubs and the diodes. The equivalent circuit diagrams for the two circuit states is shown in FIGS. 6 and 7.

Figure 6:
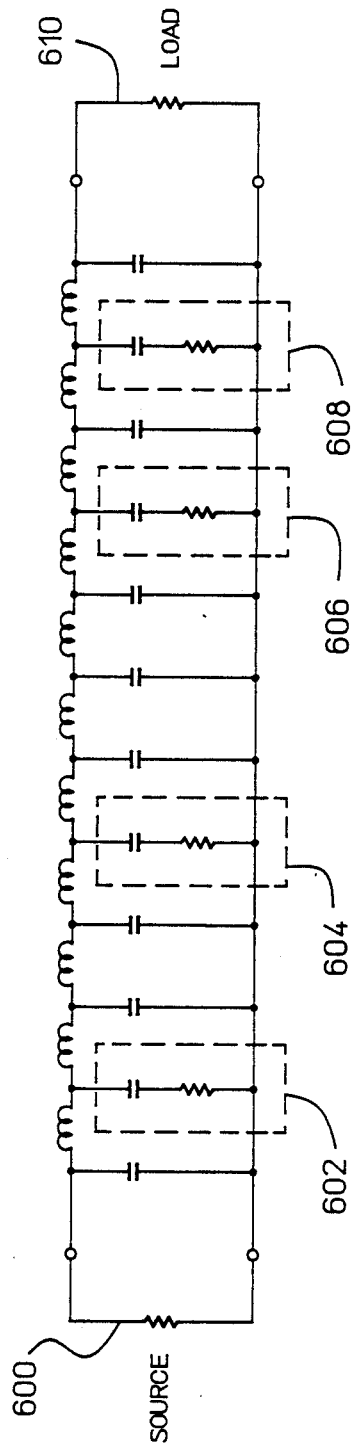
FIG. 6 is an equivalent electrical circuit diagram of an inventive modulator having four shunting diodes in the "off" state.

FIG. 6 shows the equivalent circuit diagram of the modulator when the diodes 502-510 are in their non-conducting state (the modulator structure is shown connecting a source 600 to a load 610). Diodes 602-608 appear as a small parasitic capacitances in series with the "off" resistance. The inductance of the transmission line together with the capacitance of the radial stubs forms a distributed multi-pole filter. The frequency performance of this filter can be calculated in accordance with conventional filter theory and the structure improves the insertion loss of the modulator at high end frequencies and decouples the insertion loss dependency on quarter wavelength spacing of the diodes from the maximum attenuation requirements on diode separation.

Figure 7:
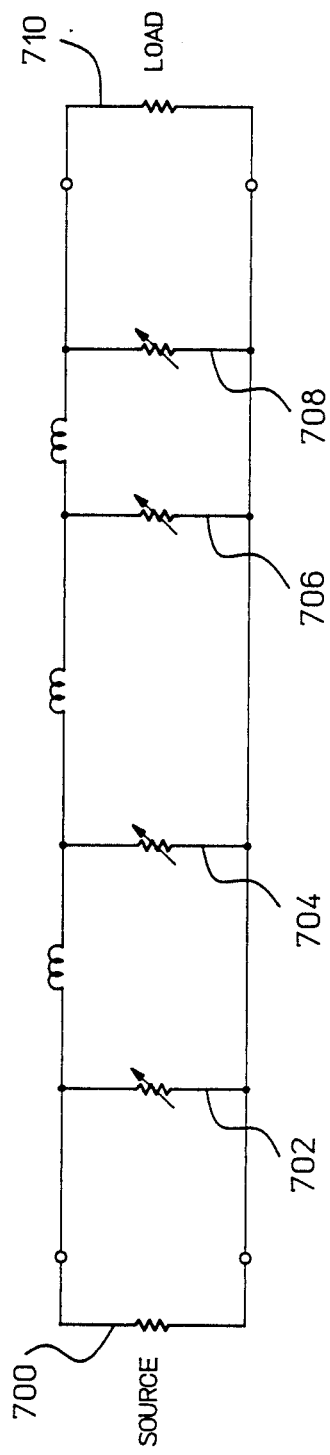
FIG. 7 is an equivalent electrical circuit diagram of an inventive modulator having four shunting diodes in the "on" state.

FIG. 7 is the equivalent circuit diagram of the modulator when diodes 502-510 are in their "on" state. As in FIG. 6, FIG. 7 shows the modulator connected between a source 700 and a load 710. When diodes 702-708 are in their "on" state, they act as variable resistances, wherein the "on" resistance depends on the forward bias current. However, in accordance with the invention, reactive cancelling still occurs even at the low end of the operating frequency range so that diodes 702-708 need not be driven into saturation in order to provide attenuation equivalent to that attainable at the high end of the operating frequency range.

Figure 8:
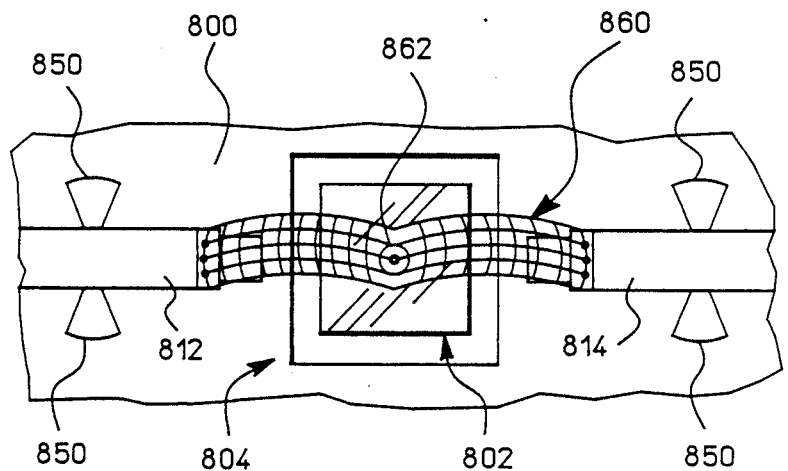
FIG. 8 is a plan view of the diode mounting arrangement in the illustrative embodiment shown in FIG. 5.
Figure 9:
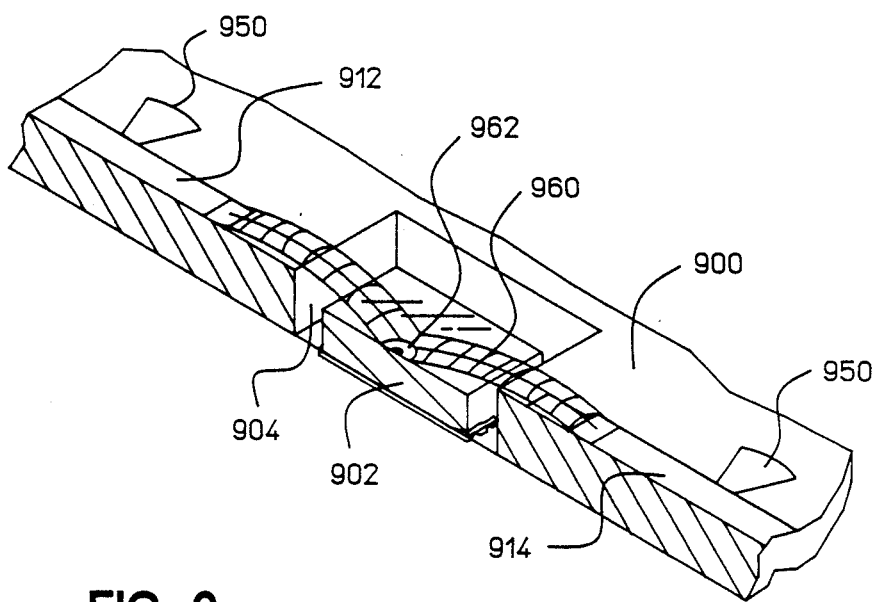
FIG. 9 is a perspective view of the diode mounting arrangement in the illustrative embodiment shown in FIG. 5.

FIGS. 8 and 9 show plan and perspective views, respectively, of an illustrative method of mounting the PIN shunt diodes 502-510 and connecting them to the circuit patterns 514-522. In particular, corresponding elements have corresponding numerals in both FIGS. 8 and 9. As mentioned previously, a typical diode 802 is mounted to the device base plate by cementing it with conductive epoxy. Diode 802 is mounted in a laser cut hole 804 which penetrates through substrate 800. Diode 802 is connected to circuit patterns 812 and 814 by a gold mesh 860 which is bonded directly to the circuit patterns. Illustratively, gold mesh 860 may be of four-square wide gold mesh which is also bonded to the diode anode at point 862.

Figure 10:
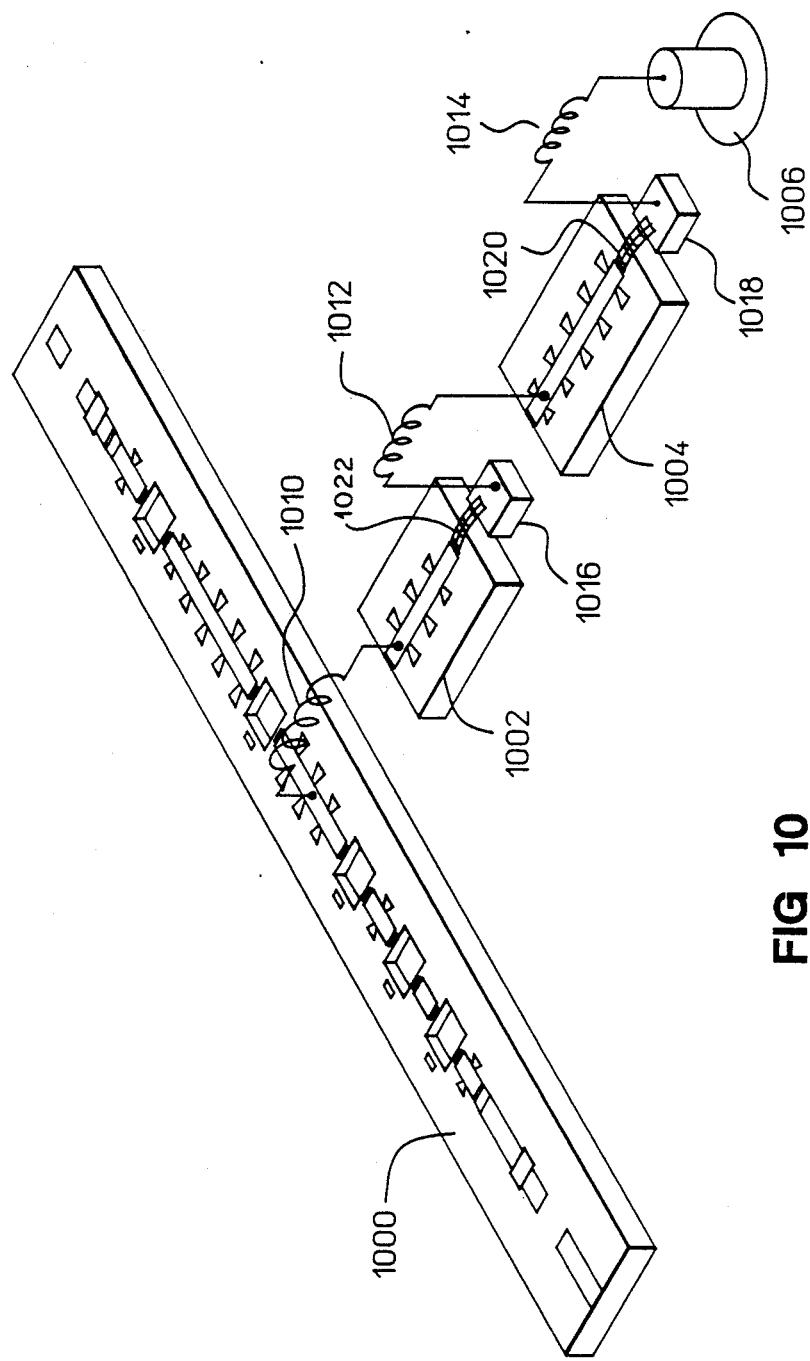
FIG. 10 is an illustrative embodiment of a biasing arrangement for a five diode inventive modulator, which biasing arrangement is suitable when the modulator is operated either as a linear modulator or a pulse modulator.

FIG. 10 shows an illustrative bias circuit which may be used with the modulator shown in FIG. 5 when the modulator is operating as either a pulse modulator or a linear modulator. In FIG. 10, modulator substrate 1000 has been shown without diodes and capacitors attached for simplicity. The bias structure consists of microstrip substrates 1002 and 1004, inductive coils 1010, 1012 and 1014 and zero picofarad DC feedthrough capacitor 1006. Substrate 1002 is connected to the main modulator substrate 1000 at a point near its center by means of coil 1010. The coils are connected to substrates 1002 and 1004 as shown and to bypass capacitors 1016 and 1018. The inductors and capacitors form a five-pole low-pass filter structure which blocks RF power from travelling back to the DC bias source.

Illustrative example

A device with the configuration shown in FIG. 5 was constructed to operate over an operating frequency range of 2 gigahertz to 26 gigahertz. With this configuration transmission line length 570 was 4.7 mm.; transmission line length 572 was 3.2 mm.; transmission line length 574 was 1.7 mm. and transmission line length 576 was 1.25 mm. The spacing between radial stubs 550 was 0.75 mm. The decoupling capacitors 524 and 526 were chosen to be 8.2 picofarad beam-lead capacitors. The bias structure was arranged as shown in FIG. 10 with capacitors 1016 and 1018 chosen as 5.6 picofarad capacitors cemented to the ground plane and connected to substrates 1002 and 1004 by means of gold mesh strips 1022 and 1020, respectively. Illustratively, coil 1010 was formed from 0.0015 inch diameter gold wire wound with five turns of approximately 0.012 inch diameter. Coil 1012 consisted of eight turns of 0.0015 inch gold wire wound on a 0.012 diameter mandril. Similarly, coil 1014 is formed of a similar material with a similar daimeter as coil 1012 and also had eight turns. The device was mounted in a closed, grounded test fixture in accordance with conventional design principles.

Figure 11:
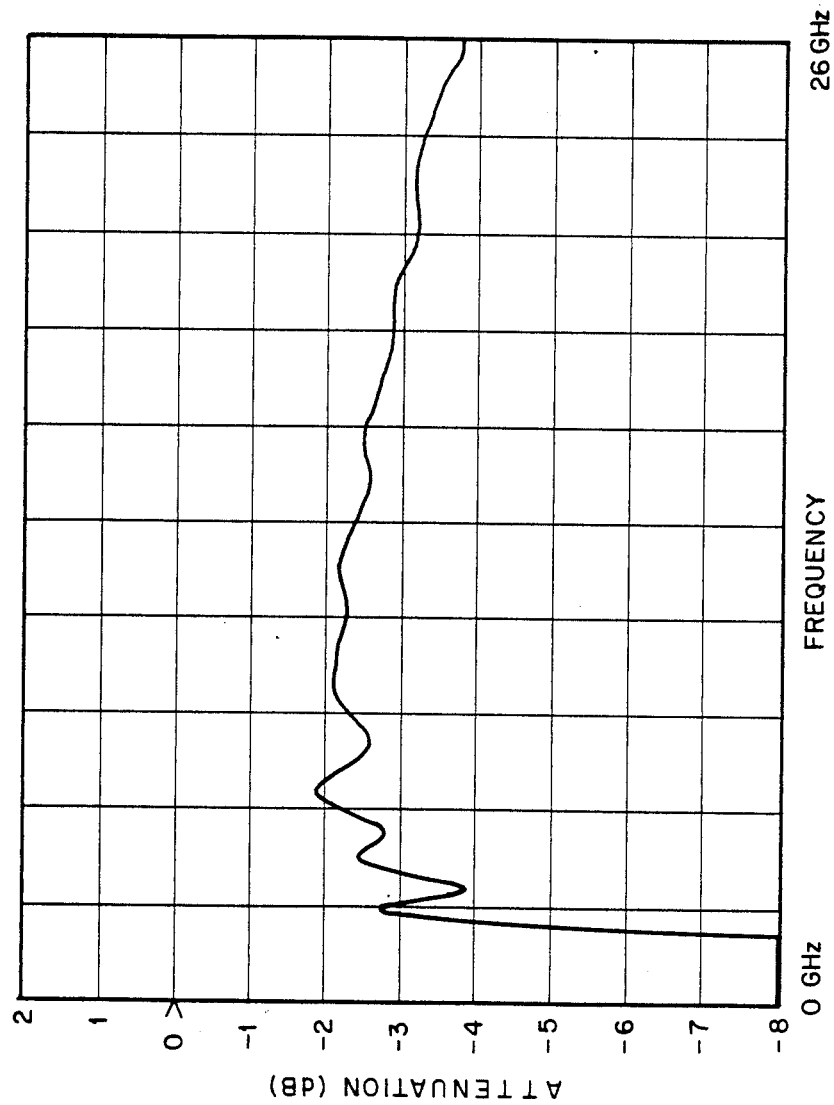
FIG. 11 is a plot of frequency versus attenuation for an illustrative device constructed in accordance with the principles of the invention showing the insertion loss over the operating frequency range.
Figure 12:
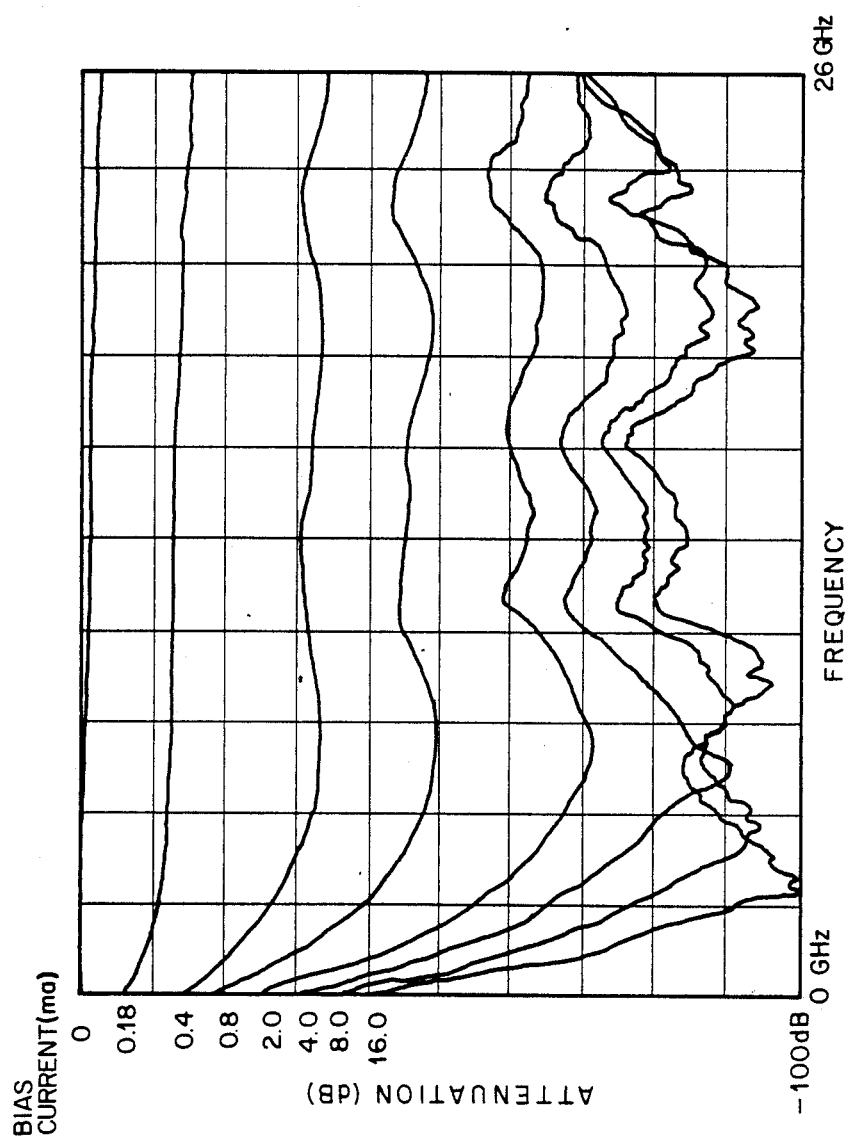
FIG. 12 is a plot of frequency versus attenuation for an illustrative device constructed in accordance with the principles of the invention showing the attenuation for various constant values of bias current.
Figure 13:
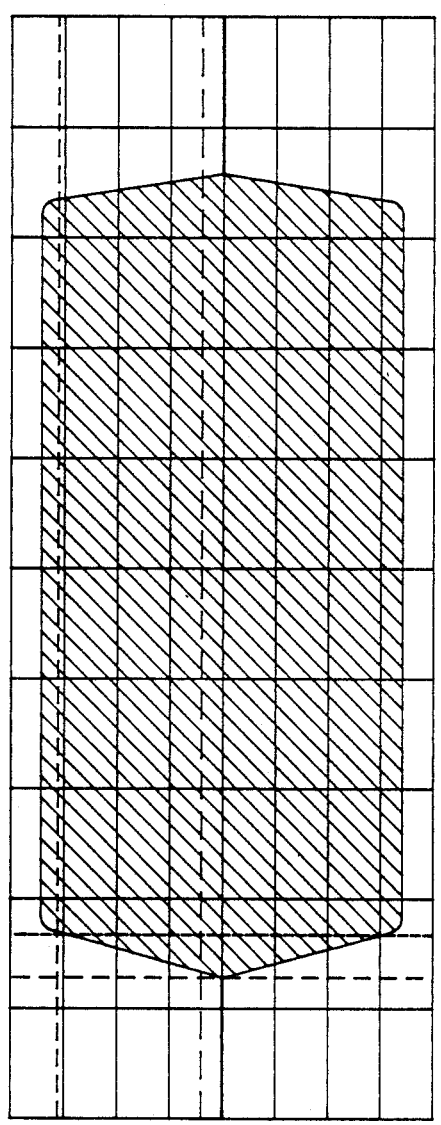
FIG. 13 is a plot of amplitude versus time for an illustrative device constructed in accordance with the priniciples of the invention showing operation as a pulse modulator.

When the above described device was tested the insertion loss was relatively low over the operating frequency range as shown in FIG. 11. The device attenuation with various constant current levels is as shown in FIG. 12. When operated as a pulse modulator, the illustrative modulator achieved an on off ratio of better than 90 dB and better than 3 nanosecond rise and fall times were measured for 30 nanosecond wide pulses. One such pulse is shown in FIG. 13.

Although only one illustrative embodiment has been disclosed herein, changes and modifications to this embodiment will become immediately obvious to those skilled in the art, which changes and modifications are intended to be covered by the claims below.

What is claimed is:

1. In a reflective shunt-diode RF modulator having an input, a first transmission line section, a second transmission line section and an output connected in series, said first transmission line section having a first electrical length and said second transmission line section having a second electrical length, a first shunt diode connecting said input to ground, a second shunt diode connecting a junction between said first transmission line section and said second transmission line section to ground and a third shunt diode connecting said output to ground and means to place said first, second and third diodes in a conducting state, the improvement wherein said first electrical length differs from said second electrical length.

2. In a reflective shunt-diode RF modulator, the improvement according to claim 1 wherein said first electrical length and said second electrical length are multiples of a predetermined length.

3. In a reflective shunt-diode RF modulator, the improvement according to claim 2 wherein said first electrical length and said second electrical length are integer multiples of a predetermined length.

4. In a reflective shunt diode RF modulator, the improvement according to claim 2 wherein said RF modulator is designed to operate up to a maximum frequency and said predetermined length is one quarter of the wavelength corresponding to said maximum frequency.

5. In a reflective shunt diode RF modulator, the improvement according to claim 1 further comprising means for providing a distributed capacitance along said first transmission line section and along said second transmission line section.

6. In a reflective shunt-diode RF modulator, the improvement according to claim 5 wherein said capacitance providing means comprises a first plurality of discrete capacitors spaced along the length of said first transmission line section and a second plurality of discrete capacitors spaced along the length of said second transmission line section.

7. A reflective shunt diode RF modulator designed to operate at RF frequencies up to a maximum frequency comprising:
    an input;
    a first transmission line section having a first electrical length, said first electrical length being an integer multiple of one quarter of the wavelength corresponding to said maximum frequency;
    a second transmission line section having a second electrical length not commensurate with said first electrical length, said second electrical length being an integer multiple of one quarter of the wavelength corresponding to said maximum frequency and said second transmission line section being connected t said first transmission line section at a junction point;
    an output, said input, said first transmission line section, said second transmission line section and said output being connected in series;
    a first shunt diode connecting said input to ground;
    a second shunt diode connecting said junction point to ground;
    a third shunt diode connecting said output to ground; and
    means to place said first, second and third diodes in a conducting state.

8. A reflective shunt-diode RF modulator according to claim 7 further comprising means for providing a distributed capacitance along said first transmission line section and along said second transmission line section.

9. A reflective shunt-diode RF modulator according to claim 8 wherein said capacitance providing means comprises a first plurality of discrete capacitors spaced along the length of said first transmission line section and a second plurality of discrete capacitors spaced along the length of said second transmission line section.

10. A reflective shunt-diode RF modulator according to claim 7 wherein said means to place said first, second and third diodes in a conducting state comprises a DC bias circuit.

11. A reflective shunt diode RF modulator according to claim 10 wherein said DC bias circuit comprises a low pass filter circuit wherein the impedance of said low pass filter circuit is substantially higher than the impedance of said first transmission line section and the impedance of said second transmission line section at operating frequencies.

12. A reflective shunt-diode RF modulator designed to operate at RF frequencies up to a maximum frequency comprising:
    an input;
    a first microstrip transmission line section connected to said input;
    a second microstrip transmission line section having a first electrical length, said first electrical length being an integer multiple of one quarter of the wavelength corresponding to said maximum frequency, said second microstrip transmission line being connected to said first transmission line section at a first junction point:
    a third microstrip transmission line section having a second electrical length not commensurate with said first electrical length, said second electrical length being an integer multiple of one quarter of the wavelength corresponding to said maximum frequency and said third transmission line section being connected to said second transmission line section at a second junction point;
    a fourth microstrip transmission line section connected to said third transmission line section at a third junction point, said fourth microstrip transmission line being connected to said output;
    a first shunt diode connecting said first junction point to ground;
    a second shunt diode connecting said second junction point to ground;
    a third shunt diode connecting said third junction point to ground; and
    DC bias means to place said first, second and third diodes in a conducting state.

13. A reflective shunt-diode RF modulator according to claim 12 further comprising a plurality of radial capacitive stubs spaced along said first, second, third and fourth microstrip transmission lines.

14. A reflective shunt diode RF modulator according to claim 13 wherein said radial capacitive stubs are spaced at an equal distance from each other and said equal distance is equal to less than one quarter of the wavelength corresponding to said maximum frequency.

15. A reflective shunt diode RF modulator according to claim 14 further comprising a first decoupling capacitor connected between said input and said first microstrip transmission line and a second decoupling capacitor connected between said fourth microstrip transmission line.

16. A reflective shunt diode RF modulator according to claim 15 wherein said dc bias means comprises a source of dc power, a first bypass capacitor, a second bypass capacitor, a fifth microstrip transmission line, a sixth microstrip transmission line, a first inductor connecting said first bypass capacitor to said power source, means for connecting said first bypass capacitor to said fifth microstrip transmission line, a second inductor connecting said fifth microstrip transmission line to said second bypass capacitor; means connecting said second bypass capacitor to said sixth microstrip transmission line and a third inductor connecting said sixth microstrip transmission line to said second junction point.

* * * * *

UNITED STATES PATENT AND TRADEMARK OFFICE
CERTIFICATE OF CORRECTION

PATENT NO. : 4,954,791

DATED : September 4, 1990

INVENTOR(S) : Mary E. Koenig

It is certified that error appears in the above-identified patent and that said Letters Patent is hereby corrected as shown below:

Column 1, Line 61, "canalling" should read -- cancelling --;

Column 9, Line 16, "connected t said" should read -- connected to said --.

Signed and Sealed this

Fifth Day of May, 1992

Attest:

DOUGLAS B. COMER

*Attesting Officer*  *Acting Commissioner of Patents and Trademarks*